(12) United States Patent
Yamada et al.

(10) Patent No.: US 9,664,874 B2
(45) Date of Patent: May 30, 2017

(54) SUBSTRATE FOR MOUNTING IMAGING ELEMENT, AND IMAGING DEVICE

(71) Applicant: KYOCERA Corporation, Kyoto-shi, Kyoto (JP)

(72) Inventors: Hiroshi Yamada, Kyoto (JP); Daiji Haruna, Kyoto (JP); Akihiko Funahashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/787,345

(22) PCT Filed: Jul. 30, 2014

(86) PCT No.: PCT/JP2014/070089
§ 371 (c)(1),
(2) Date: Oct. 27, 2015

(87) PCT Pub. No.: WO2015/016270
PCT Pub. Date: Feb. 5, 2015

(65) Prior Publication Data
US 2016/0116701 A1 Apr. 28, 2016

(30) Foreign Application Priority Data
Jul. 30, 2013 (JP) .................................. 2013-157861

(51) Int. Cl.
*G02B 7/02* (2006.01)
*H04N 5/232* (2006.01)
(Continued)

(52) U.S. Cl.
CPC ........... *G02B 7/02* (2013.01); *G02B 27/0006* (2013.01); *H01L 27/14618* (2013.01);
(Continued)

(58) Field of Classification Search
CPC H04N 5/232; H04N 5/2253; H04L 27/14618; H04L 27/14625; G02B 7/02; G02B 27/0006
See application file for complete search history.

(56) References Cited

U.S. PATENT DOCUMENTS 4,561,015 A * 12/1985 Korch ................. H04N 5/2253
348/240.99
2004/0069998 A1* 4/2004 Harazono ......... H01L 27/14618
257/81
(Continued)

FOREIGN PATENT DOCUMENTS

JP 2005-020687 A 1/2005
JP 2005-252223 A 9/2005
(Continued)

OTHER PUBLICATIONS

International Search Report, PCT/JP2014/070089, Nov. 4, 2014, 2 pgs.
(Continued)

*Primary Examiner* — Luong T Nguyen
(74) *Attorney, Agent, or Firm* — Volpe and Koenig, P.C.

(57) ABSTRACT

A substrate for mounting an imaging element is a substrate for mounting an imaging element that includes a base. The base has: a through-hole having an opening in a top surface of the base; a cover mounting region provided on the top surface, in a rim of the opening of the through-hole; a lens-housing mounting region 8 provided on the top surface, on an outer side of the cover mounting region; an intermediate region provided on the top surface, between the cover mounting region and the lens-housing mounting region; a connecting section that enables the intermediate region to communicate with an inside wall of the through-hole; and an imaging element mounting section provided on a bottom surface of the base.

11 Claims, 7 Drawing Sheets

(51) Int. Cl.
  *H04N 5/225*      (2006.01)
  *H01L 27/146*     (2006.01)
  *G02B 27/00*      (2006.01)

(52) U.S. Cl.
  CPC .......... *H04N 5/2253* (2013.01); *H04N 5/232* (2013.01); *H01L 27/14625* (2013.01)

(56) References Cited

U.S. PATENT DOCUMENTS

| | | |
|---|---|---|
| 2005/0169620 A1 | 8/2005 | Minamio et al. |
| 2005/0254133 A1* | 11/2005 | Akram .................. G02B 7/02 359/626 |
| 2007/0030334 A1 | 2/2007 | Nishizawa |
| 2010/0172037 A1* | 7/2010 | Ishigami .................. G02B 7/02 359/819 |
| 2010/0208132 A1 | 8/2010 | Shiraishi |
| 2013/0027602 A1* | 1/2013 | Kasuga ................ H04N 5/2257 348/335 |

FOREIGN PATENT DOCUMENTS

| | | |
|---|---|---|
| JP | 2006-100425 A | 4/2006 |
| JP | 2010-193059 A | 9/2010 |
| JP | 2012-009920 A | 1/2012 |
| JP | 2013-110593 A | 6/2013 |

OTHER PUBLICATIONS

Extended European Search Report, European Patent Application No. 14832903.0, Mar. 10, 2017, 6 pgs.

\* cited by examiner

SUBSTRATE FOR MOUNTING IMAGING ELEMENT, AND IMAGING DEVICE

TECHNICAL FIELD

The present invention relates to a substrate for mounting an imaging element, on which an imaging element such as a charge coupled device (CCD) or a complementary metal oxide semiconductor (CMOS) is mounted, and to an imaging device.

BACKGROUND

An imaging device in which an imaging element such as a CCD or a CMOS is mounted on a substrate for mounting an imaging element has been known for some time. The substrate for mounting an imaging element is formed of an insulating base having an insulation layer, the imaging element is mounted thereon, and the substrate is sealed using a cover formed of, for example, an optical filter, glass, or crystal. An imaging device is known in which a lens holder to which a plurality of lenses are attached is joined to the substrate for mounting an imaging element on which an imaging element is mounted and that has been sealed by a cover, and an optical distance is varied by varying the positions of the plurality of lenses. (For example, see Patent Document 1.)

Meanwhile, in such an imaging module, a region between the plurality of lenses and the cover and a region between the cover and the imaging element are each sealed.

PRIOR ART DOCUMENT

Patent Document

Patent Document 1: Japanese Unexamined Patent Application Publication No. 2010-193059A

SUMMARY OF THE INVENTION

Problems to be Solved by the Invention

However, increases in the power of zoom functions in recent imaging modules have led to demand for varying the positions of the plurality of lenses attached to the lens holder of the imaging module more than in the past. The volume of the region between the lenses and the cover changes greatly upon the position of the lenses being varied greatly. At this time, a sudden change in the volume of air within the region between the lens and the cover resulting in a sudden change in air pressure, in turn causing condensation produced between the lenses and the cover to adhere to the lenses or the cover and causing image noise to appear in an image when the image is captured, has been a concern.

In light of the aforementioned problem, an object of the present invention is to provide a substrate for mounting an imaging element and an imaging device that suppress sudden changes in air pressure within an imaging module and suppress condensation from forming on a cover, a surface of a lens, and the like.

Means to Solve the Problem

A substrate for mounting an imaging element according to one aspect of the present invention is a substrate for mounting an imaging element including a base. The base includes: a through-hole having an opening in a top surface of the base; a cover mounting region provided on the top surface, in a rim of the opening of the through-hole; a lens-housing mounting region provided on the top surface, on an outer side of the cover mounting region; an intermediate region provided on the top surface, between the cover mounting region and the lens-housing mounting region; a connection section that enables the intermediate region to communicate with an inside wall of the through-hole; and an imaging element mounting section provided on a bottom surface of the base.

An imaging device according to one aspect of the present invention includes: the aforementioned substrate for mounting an imaging element; an imaging element mounted on the imaging element mounting section of the substrate for mounting an imaging element; and when viewed in a see-through plan view, a transparent cover disposed in the cover mounting region so as to cover the opening.

Effects of the Invention

According to the substrate for mounting an imaging element configured as described above, the connecting section enables the intermediate region of the top surface of the substrate for mounting an imaging element, located between the cover mounting region and the lens-housing mounting region, to communicate with the inside wall of the through-hole. Accordingly, even in the case where the position of a lens has fluctuated, air can be circulated between the inside wall of the through-hole and the intermediate region through the connecting section, which makes it possible to reduce sudden changes in air pressure caused by fluctuations in the volume of a space above the intermediate region, and makes it possible to suppress condensation from forming on the cover, a surface of the lens, and the like.

Meanwhile, according to the imaging device configured as described above, the substrate for mounting an imaging element configured as described above is provided, and thus a high-quality image having less image noise caused by condensation and the like can be obtained.

BRIEF DESCRIPTION OF THE DRAWING(S)

BEST MODE FOR CARRYING OUT THE INVENTION

Figure 1A:
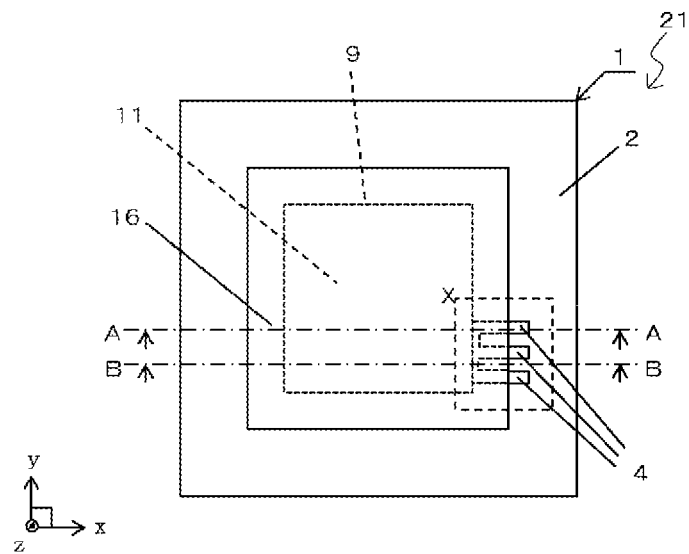
FIG. 1A is a see-through plan view illustrating an imaging device according to an embodiment of the present invention.

Several exemplary embodiments of the present invention will be described hereinafter with reference to the drawings. Note that in the following descriptions, a device in which an imaging element and a cover are mounted on a substrate for mounting an imaging element will be called an imaging device.

First Embodiment

An imaging device 21 according to an embodiment of the present invention will be described with reference to FIGS. 1A to 7D. Note that FIGS. 1A to 2C illustrate the same embodiment. The imaging device 21 according to the present embodiment includes a substrate for mounting an imaging element 1 and an imaging element 11 mounted on the substrate for mounting an imaging element 1. Any direction may be defined as upward or downward for the substrate for mounting an imaging element 1, but for the sake of simplicity, an xyz orthogonal coordinate system will be used here, with a positive side in the z direction defined as upward and the terms "top surface" and "bottom surface" being used.

The substrate for mounting an imaging element 1 includes a base 2 having a through-hole 9. In the example illustrated in FIGS. 1A to 1C, the substrate for mounting an imaging element 1 includes the base 2 that has layers 2a, imaging element connection pads 3 provided on a bottom surface of the layers 2a, and connecting sections 4 provided on the base 2.

Figure 1B:
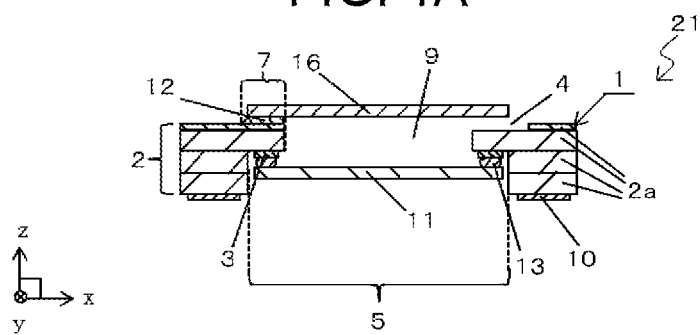
FIG. 1B is a cross-sectional view illustrating a vertical cross-section taken along the A-A line in FIG. 1A.
Figure 1C:
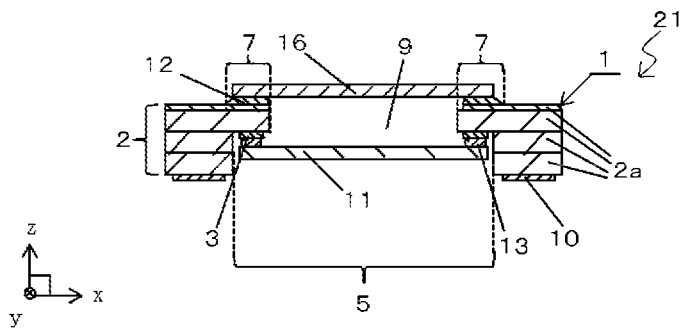
FIG. 1C is a cross-sectional view illustrating a vertical cross-section taken along the B-B line in FIG. 1A.
Figure 2A:
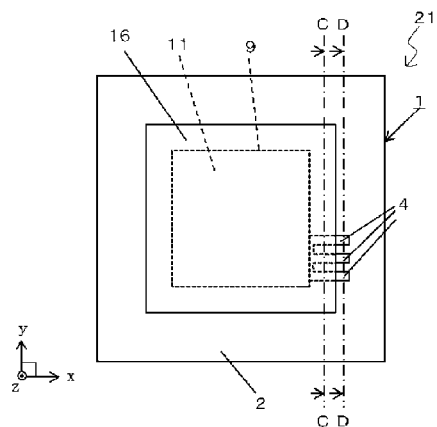
FIG. 2A is a see-through plan view illustrating an imaging device according to the embodiment of the present invention.
Figure 2B:
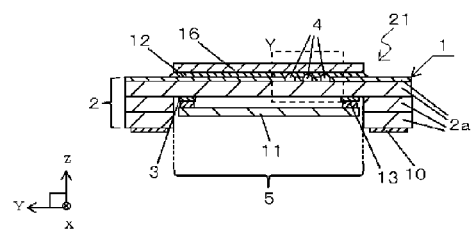
FIG. 2B is a cross-sectional view illustrating a vertical cross-section taken along the C-C line in FIG. 2A.
Figure 2C:
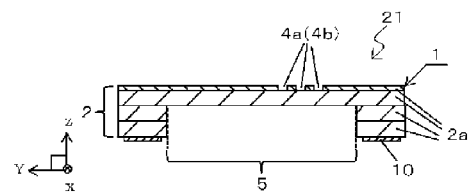
FIG. 2C is a cross-sectional view illustrating a vertical cross-section taken along the D-D line in FIG. 2A.

As illustrated in FIGS. 1A to 1C, the base 2 includes the through-hole 9 which has an opening in the top surface of the base 2. In addition, as illustrated in FIGS. 1A to 1C, the base 2 has a cover mounting region 7 provided in the rim of the opening of the through-hole 9 on the top surface, a lens-housing mounting region 8 provided on an outer side of the cover mounting region 7 on the top surface, and an intermediate region 6 provided between the cover mounting region 7 and the lens-housing mounting region 8 on the top surface.

The cover mounting region 7 is a region where a cover 16 is mounted. The lens-housing mounting region 8 is a region where a lens housing 14 is mounted. The intermediate region 6 is a region that communicates with an inside wall of the through-hole 9 via the connecting sections 4.

In addition, as illustrated in FIGS. 1A to 1C, the base 2 has an imaging element mounting section 5 on the bottom surface of the base 2. The imaging element 11 is mounted on the imaging element mounting section 5.

The base 2 is formed by vertically laminating, for example, a plurality of substantially quadrangular insulation layers formed of electrically-insulating ceramics such as an aluminum oxide-based sintered body, a mullite-based sintered body, a silicon carbide sintered compact, an aluminum nitride sintered body, a silicon nitride-based sintered body, or a glass ceramic sintered body, a resin such as a fluorine-based resin, including an epoxy resin, a polyimide resin, an acrylic resin, a phenol resin, a polyester resin, an ethylene tetrafluoride resin, or the like.

The layers 2a that form the base 2 may be constituted of four layers as illustrated in FIGS. 1A to 1C, or may be a single or two or more layers as well. The layers 2a have a through-hole, as illustrated in FIGS. 1A to 1C.

In the example illustrated in FIGS. 1A to 1C, there are four layers 2a, and by setting an opening in the lower layers 2a to be larger than an opening in the upper layers, a step portion is provided from the bottom surface of the upper layers to the inner periphery of the lower layers. The imaging element connection pads 3 are provided on a bottom surface of the upper layer that configures this step portion. With respect to the openings in the layers 2a, the area of the openings in the lower layers 2a may be set to the same area as the openings in the upper layers, when viewed in a see-through plan view. In this case, the imaging element connection pads 3 are provided on the bottom surface of the lowermost layer 2a.

In the example illustrated in FIGS. 1A to 1C, an external terminal 10 is provided on the bottom surface of the base 2. A wire conductor may be provided between the layers 2a within the base 2, or the external terminal 10 and the imaging element connection pads 3 may be electrically connected by such a wire conductor, a through-hole conductor, or the like. Note that the external terminal 10 may be provided on the side surface or the top surface of the base 2.

The plurality of imaging element connection pads 3 are provided on the bottom surface of the base 2, and are electrically connected to respective electrodes of the imaging element 11 by joining members 13 such as gold bumps. In the case where the base 2 is formed from an electrically-insulative ceramic, the imaging element connection pads 3 are formed by metallizing tungsten (W), molybdenum (M), manganese (Mn), silver (Ag), copper (Cu), or the like.

Meanwhile, in the case where the base 2 is formed from a resin, the imaging element connection pads 3 are formed from a metal material such as copper (Cu), gold (Au), aluminum (Al), nickel (Ni), chrome (Cr), molybdenum (Mo), titanium (Ti), an alloy thereof, or the like.

In order to protect the imaging element connection pads 3 and the external terminal 10 from oxidization, and to ensure a good electrical connection with the imaging element 11, an external circuit board, or the like, a 0.5 to 10 µm-thick Ni plated layer may be disposed on exposed surfaces of the imaging element connection pads 3 and the external terminal 10 or this Ni plated layer and a 0.5 to 3 µm-thick gold (Au) plated layer are deposited thereon in that order.

Next, the imaging device illustrated in FIGS. 1A to 1C will be described. This imaging device includes the substrate for mounting an imaging element 1, the imaging element 11 mounted on the imaging element mounting section 5 of the substrate for mounting an imaging element 1, and the transparent cover 16 disposed, when viewed in a see-through plan view, in the cover mounting region 7 so as to cover the opening of the through-hole 9.

The imaging element 11 is, for example, a CCD imaging element or a CMOS imaging element. The electrodes of the imaging element 11 are electrically connected to corresponding imaging element connection pads 3 by the joining members 13 (gold bumps or the like). Aside from gold bumps, bonding wires, solder, or the like can be used for the joining members 13. In addition, outer peripheral portions of the base 2 and the imaging element 11 are bonded to each other by a sealing member (not illustrated) formed from a resin or the like, which causes a light receiving surface to be blocked off from outside air and sealed. Meanwhile, the base 2 includes the cover mounting region 7, which is a region where the cover 16 is mounted. The cover 16, which is formed of a transparent member such as crystal or glass, is mounted in the cover mounting region 7, and the cover 16 is joined at a position where the cover 16 covers the opening of the through-hole 9, when viewed in a see-through plan view. At this time, the base 2 and the cover 16 are joined by a sealing member 12 formed from a resin or the like.

Next, an imaging module 22, illustrated in FIG. 3, will be described. Note that in the following descriptions, an entity formed by mounting a lens housing on a substrate for mounting an imaging element in an imaging device will be called an "imaging module".

Figure 3:
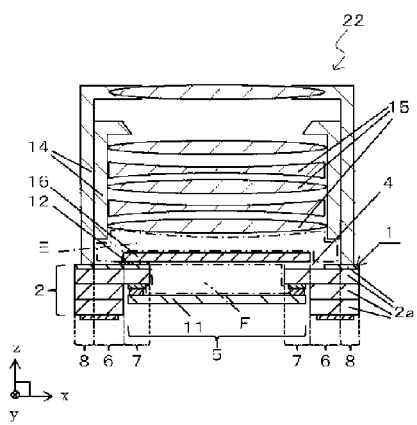
FIG. 3 is a cross-sectional view illustrating an imaging module according to the embodiment of the present invention.

In the example illustrated in FIG. 3, the lens housing 14 is mounted on a lens-housing mounting portion 8. A plurality of lenses 15 are mounted in the lens housing 14, and the optical distance can be varied by moving the plurality of lenses 15 up and down within the lens housing 14.

In FIG. 3, the imaging module 22 has a first region E and a second region F. Here, "first region E" refers to a region (a space) surrounded by the base 2, the lens housing 14, the lenses 15, and the cover 16. Meanwhile, "second region F" refers to a region (a space) surrounded by the base 2, the imaging element 11, and the cover 16.

The connecting sections 4 are provided on the top surface of the base 2. Inner-side end portions of the connecting sections 4 open into the inside wall of the through-hole 9 in the base 2, and outer-side end portions of the connecting sections 4 open into the intermediate region 6. The connecting sections 4 enable the imaging element mounting section 5 and the intermediate region 6 to communicate, and provide a region for air to circulate between the first region E and the second region F. Accordingly, even in the case where the lenses 15 in the lens housing 14 have moved up or down and the volume of the first region E has changed, air can be circulated between the first region E and the second region F via the connecting sections 4. This makes it possible to reduce sudden air pressure changes in the first region E or the second region F, which in turn makes it possible to suppress condensation from forming on the cover 16, the lenses 15, and so on.

In the example illustrated in FIGS. 1A to 1C, the connecting sections 4 are positioned so that, when viewed in a plan view, one end portion of each connecting section 4 is located further outside than the cover mounting region 7 and further inside than the lens-housing mounting region 8. According to this configuration, those one end portions (outside end portions) do not open to the outside of the base 2, and thus the first region E and the second region F are blocked off from outside air by the lens housing 14, the substrate for mounting an imaging element 1, and the imaging element 11. As such, it is possible to reduce instances where dust and the like enter with outside air, adhering to the imaging element 11 through the connecting sections 4. Accordingly, it is also possible to reduce drops in image quality caused by dust and the like.

However, as long as the connecting sections 4 ensure that the intermediate region 6 communicates with the inside wall of the through-hole 9, the outside end portions of the connecting sections 4 may be open to the exterior of the base 2, unlike the example illustrated in FIGS. 1A to 1C.

In the examples illustrated in FIGS. 4A to 4D, the base 2 has grooves 4a that form the connecting sections 4. In the example illustrated in FIGS. 4A to 4D, the base 2 is formed of the plurality of layers 2a, and the grooves 4a are formed of slits 4b provided in the uppermost layer. To be more specific, the grooves 4a are formed by the top surface of the second layer from the top in the base 2 and the inside walls of the slits 4b.

Figure 4A:
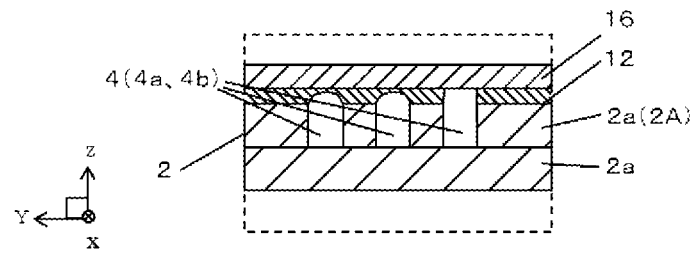
FIGS. 4A to 4D are enlarged cross-sectional views illustrating variations of the Y portion illustrated in FIG. 2B.

In the example illustrated in FIG. 4A, all of the layers 2a that form the base 2 are formed from, for example, an electrically-insulative ceramic, and the slits 4b are provided in the uppermost layer 2a (2A). According to this configuration, for example, the connecting sections 4 can be provided through a screen printing method, which makes it possible to prevent the thickness of the base 2 from increasing. Furthermore, according to this configuration, the screen printing method enables the connecting sections 4 to be provided with ease.

Note that the grooves 4a may be less deep than the thickness of the uppermost layer 2a (2A). In this case, the grooves 4a do not pass through to the top surface of the second layer from the top, in the depth direction.

Meanwhile, as with the example illustrated in FIG. 4A, the cover 16 and the substrate for mounting an imaging element 1 are joined by the sealing member 12, and groove portions are provided in the sealing member 12 along the grooves 4a. Accordingly, air can move between the first region E and the second region F through the groove portions in addition to the connecting sections 4. Furthermore, according to this configuration, the size of the connecting sections 4 can be increased by an amount equivalent to the groove portions while at the same time suppressing the thickness of the uppermost layer 2a of the base 2.

The slits 4b can be formed by punching out a ceramic green sheet, stacking that ceramic green sheet onto another ceramic green sheet, and compressing the resulting laminated body that will serve as the base 2. In this case, a ceramic green sheet having a thickness of 50 μm or more is often used for the uppermost layer 2a (2A), which results in larger connecting sections 4; this makes it easy for air to move between the region E and the region F, and makes it possible to suppress the air from inhibiting the movement of the lenses 15.

Figure 4B:
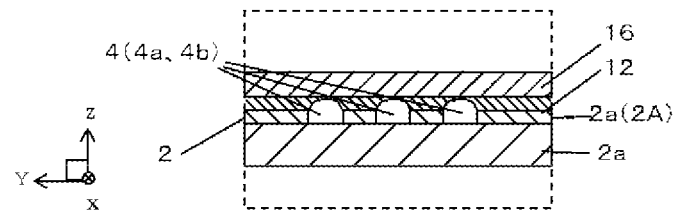
Figure 4C:
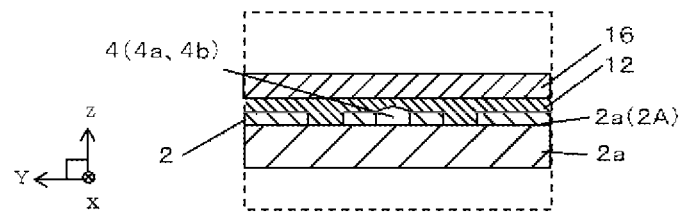
Figure 4D:
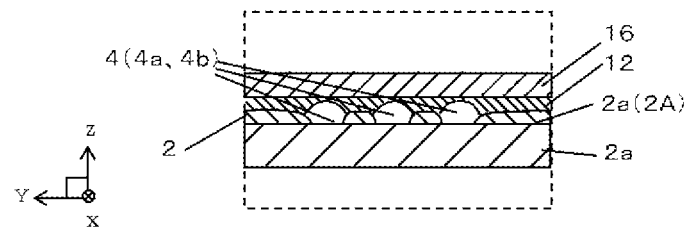

Meanwhile, in the examples illustrated in FIGS. 4B to 4D, the uppermost layer 2a (2A) of the base 2 is formed from a ceramic material or a metal material, and the other layers 2a are formed from a ceramic material.

Furthermore, groove portions are provided in the sealing member 12 along the grooves 4a in the examples illustrated in FIGS. 4B to 4D as well.

Meanwhile, the same number of connecting sections 4 as the grooves 4a may be formed, as in the examples illustrated in FIGS. 4B and 4D, or fewer connecting sections 4 than grooves 4a may be formed, as illustrated in FIG. 4C.

In addition, in the examples illustrated in FIGS. 4B to 4D, a coating layer that will serve as the uppermost layer 2a (2A) is printed onto the top surface of the second layer 2a from the top through a screen printing method or the like. By patterning the coating layer to have the slits 4b at the time of printing, the uppermost layer 2a (2A) is formed having the slits 4b.

To manufacture the particular example illustrated in FIG. 4D, the coating layer may be compressed from the top surface after the screen printing.

Note that in the case where the uppermost layer 2a (2A) is a metal material, the uppermost layer 2a (2A) may be formed by first forming a metal layer that will serve as the uppermost layer 2a (2A) and then etching the metal layer using a predetermined mask pattern.

Similarly, in the case where the layers 2a are formed from a resin material, the uppermost layer 2a (2A) may be formed by first forming a resin layer that will serve as the uppermost layer 2a (2A) and then etching the resin layer using a predetermined mask pattern.

In this manner, the slits 4*b* formed through the screen printing method or the like can be formed having a low thickness of approximately 2 to 15 μm, and thus even if dust or the like has entered into the region E, instances where the dust or the like adheres to the imaging element 11 when air moves through the connecting sections 4 can be reduced.

Meanwhile, it is preferable that, when viewed in a vertical cross-section, the grooves 4*a* formed in the uppermost layer 2*a* (2A) increase in width toward the upper side thereof, as in the example illustrated in FIG. 4D. In this case, the connecting sections 4 can be provided having a larger size when joining the cover 16 and the uppermost layer 2*a* (2A) using the sealing member 12. In addition, in this case, the width of the bottom surfaces of the grooves 4*a* can be reduced while increasing the width of the connecting sections 4 above the grooves 4*a*, and thus many grooves 4*a* can be formed in the uppermost layer 2*a* (2A). Accordingly, it is even easier for air to move between the region E and the region F through the connecting sections 4.

By providing a plurality of connecting sections 4, air can move easily between the first region E and the second region F through the connecting sections 4, which makes it possible to suppress the air from inhibiting the movement of the lenses 15.

Meanwhile, in the case where a plurality of grooves 4*a* are provided, the connecting sections 4 may be provided in the sealing member 12 along at least one of those grooves 4*a*.

A method for forming the connecting sections 4 as illustrated in FIGS. 4A to 4D will be described next. In the examples illustrated in FIGS. 4A to 4D, when the cover 16 is bonded to the base 2, it is common to carry out a reflow process or the like, where the sealing member 12 is applied in advance to the bottom surface of the cover 16 or the top surface of the base 2 at a constant thickness and the two are then brought into contact with each other. However, in the case where the sealing member 12 is thick, applying the sealing member 12 at a constant thickness will result in the melted sealing member 12 entering into the grooves 4*a* during the reflow process, making it difficult to provide the desired number of connecting sections 4. As such, it is preferable that the sealing member 12 be applied to the bottom surface of the cover 16 or the top surface of the base 2 in areas aside from locations corresponding to the grooves 4*a* where the connecting sections 4 are to be provided. This makes it possible to prevent the sealing member 12 from entering into the grooves 4*a* where the connecting sections 4 are to be formed and to form the desired number of connecting sections 4.

Meanwhile, in the case where three or more grooves 4*a* are provided in a row as in the example illustrated in FIG. 4C, the configuration will be such that a connecting section 4 will only be provided in the central groove 4*a* as illustrated in FIG. 4C, even if the sealing member 12 is applied in advance at a constant thickness on the entire periphery of the cover 16. This is because during the reflow process, the melted sealing member 12 flows into the grooves 4*a* located on both sides and a reduced amount of the sealing member 12 flows into the groove 4*a* in the center, and as a result, a connecting section 4 is formed only in the central groove 4*a*. According to the configuration illustrated in FIG. 4C, a single connecting section 4 can be secured with certainty. Furthermore, because the grooves 4*a* are filled with the sealing member 12, the joining strength between the cover 16 and the base 2 can be improved.

Figure 5A:
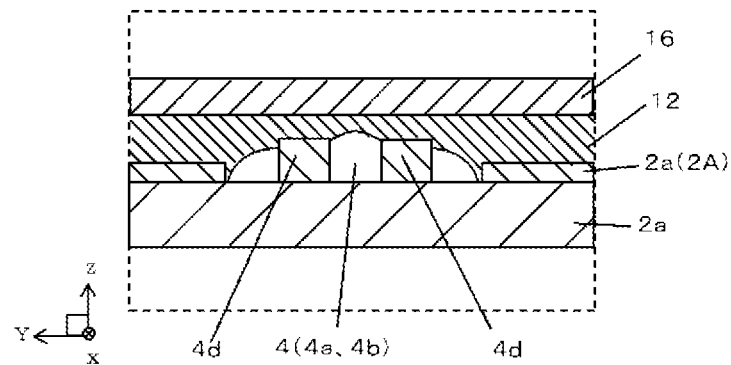
FIGS. 5A to 5C are enlarged cross-sectional views illustrating variations of the Y portion illustrated in FIG. 2B.
Figure 5B:
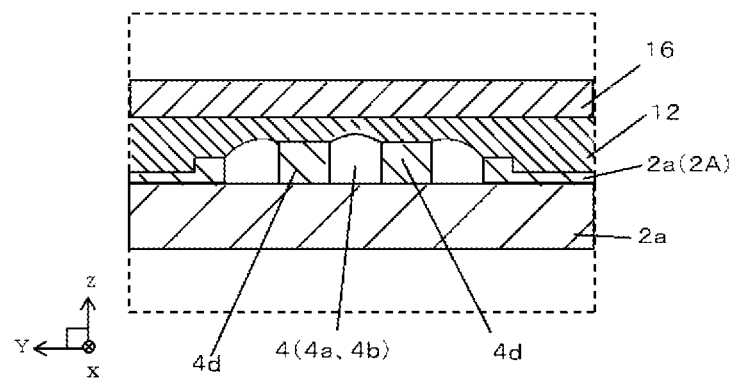
Figure 5C:
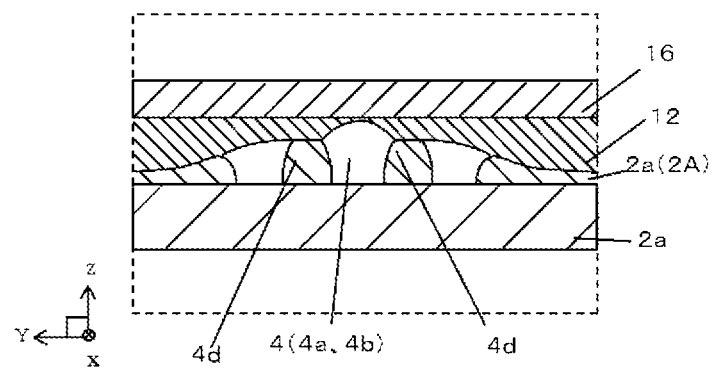

In the examples illustrated in FIGS. 5A to 5C, an area between the connecting sections 4 is thicker than the other areas in the uppermost layer 2*a* (2A). According to this configuration, the sealing member 12 located in the vicinity of the connecting sections 4 flows more easily to the thinner areas of the uppermost layer 2*a* (2A). As such, the connecting sections 4 can be set to approximately the same height as the area between the connecting sections 4. The cross-sectional area of the connecting sections 4 can thus be increased, and thus it is even easier for air to move between the region E and the region F.

Meanwhile, the area between the connecting sections 4 is thicker than the other areas, and thus even if there is unevenness in the amount of the applied sealing member 12, the connecting sections 4 can be formed with certainty.

In the examples illustrated in FIGS. 5B and 5C, of the stated other areas, end portions adjacent to the connecting sections 4 are thicker than the areas aside from those end portions. Accordingly, a step portion can be provided in the stated other areas, which makes it possible to cause the sealing member 12 located in the vicinity of the connecting sections 4 to flow even more easily toward the thinner areas of the uppermost layer 2*a* (2A). This makes it possible to increase the height of the connecting sections 4 on the sides of the stated other areas.

In the example illustrated in FIG. 5C, the inside walls of the grooves 4*a* are inclined so that the grooves 4*a* broaden toward the upper side thereof. The sealing member 12 can therefore flow toward the stated other areas with ease, and the height of the connecting sections 4 can be increased further as a result. Furthermore, as illustrated in FIG. 5C, forming the grooves 4*a* with the inside walls thereof inclined so that the grooves 4*a* broaden toward the upper side of the grooves 4*a* provides a structure in which, in a process of sealing using the sealing member 12, it is more difficult for air to accumulate at the step portion or corner portions of wall portions 4*d* than in the example illustrated in FIG. 5B. This makes it possible to cause more of the sealing member 12 to flow to both sides, and to increase the joint strength between the cover 16 and the uppermost layer 2*a* (2A).

To manufacture the examples illustrated in FIGS. 5A to 5C, for example, a coating layer is first printed through a screen printing method, and the areas to be made thicker may then be screen-printed again. The coating layer created in this manner then serves as the uppermost layer 2*a* (2A).

Meanwhile, in the case where the uppermost layer 2*a* (2A) is a metal material, a metal layer that is to become the uppermost layer 2*a* (2A) may first be formed, and the metal layer may be etched a plurality of times using different mask patterns, for example.

Likewise, in the case where the layers 2*a* are formed from a resin material, a resin layer that is to become the uppermost layer 2*a* (2A) may first be formed, and the resin layer may be etched a plurality of times using different mask patterns.

In addition, to manufacture the particular example illustrated in FIG. 5C, the coating layer may be compressed from the top surface after a plurality of screen printing.

Figure 6A:
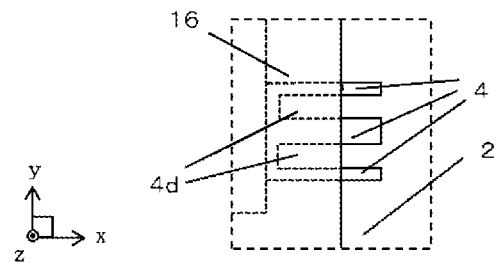
FIGS. 6A to 6D are enlarged see-through plan views illustrating variations of the X portion illustrated in FIG. 1A.
Figure 6B:
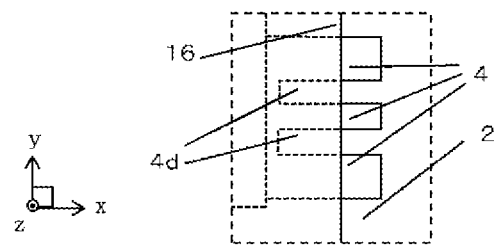

In the examples illustrated in FIGS. 6A and 6B, the connecting sections 4 are formed of three grooves 4*a*. In the example illustrated in FIG. 6A, the area of the groove 4*a* located in the center is greater than the areas of the grooves 4*a* located on both sides thereof, and thus the connecting section 4 formed of the groove 4*a* located in the center can be made larger, making it possible to suppress the connecting section 4 from being blocked by the sealing member 12. Meanwhile, in the example illustrated in FIG. 6B, the area of the groove 4*a* located in the center is smaller than the areas of the grooves 4*a* located on both sides thereof, and thus when the base 2 and the cover 16 are joined using the sealing member 12, a greater amount of the sealing member 12 flows into the grooves 4a on both sides, making it possible to provide the groove 4a located in the center with more certainty.

Figure 6C:
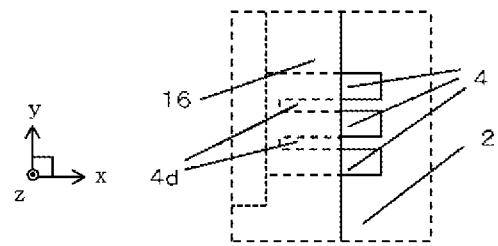
Figure 6D:
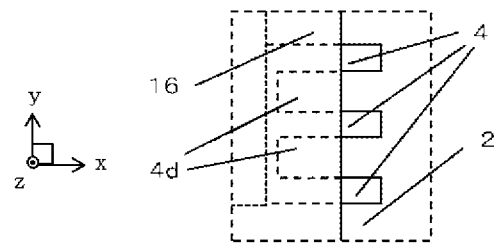

In the examples illustrated in FIGS. 6C and 6D, the connecting sections 4 are formed of three grooves 4a. In the example illustrated in FIG. 6C, the widths of wall portions 4d that separate adjacent grooves 4a are lower than the widths of the grooves 4a, making it possible to provide more connecting sections 4 in a region having the same area and to ensure good air movement between the region E and the region F. Meanwhile, in the example illustrated in FIG. 6D, the widths of the wall portions 4d that separate adjacent grooves 4a are lower than the widths of the grooves 4a, and thus when the base 2 and the cover 16 are joined by the sealing member 12, the joint area increases, which makes it possible to increase the joint strength.

Figure 7A:
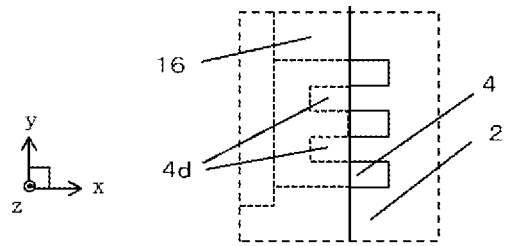
FIGS. 7A to 7D are enlarged see-through plan views illustrating variations of the X portion illustrated in FIG. 1A.
Figure 7B:
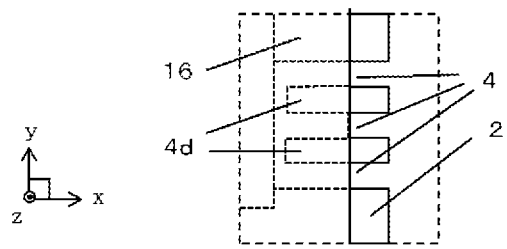
Figure 7C:
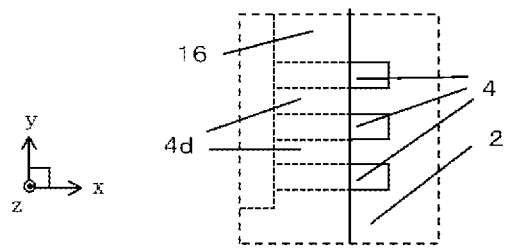
Figure 7D:
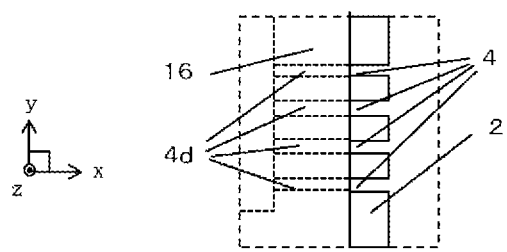

Meanwhile, when the grooves 4a that form the connecting sections 4 are viewed in a see-through plan view, adjacent grooves 4a may be connected to each other within a region where those grooves 4a overlap with the cover 16, as in the examples illustrated in FIGS. 7A and 7B, or the grooves 4a may be separated from each other by the wall portions 4d up to the through-hole 9, as in the examples illustrated in FIGS. 7C and 7D. When, in a see-through plan view, adjacent grooves 4a are connected to each other within the region where those grooves 4a overlap with the cover 16, the openings of the connecting sections 4 become narrow in areas not overlapping with the cover 16 when viewed in a see-through plan view and become wide in the overlapping region when viewed in a see-through plan view. Accordingly, when air moves between the region E and the region F through the connecting sections 4, dust and the like can be prevented from entering into the region F from the region E and adhering to the imaging element 11, and the air can move more easily between the region E and the region F through the connecting sections 4. Meanwhile, when, in a see-through plan view, adjacent grooves 4a are separated from each other by the wall portions 4d in the region that overlaps with the cover 16, the sealing member 12 can be stopped by the grooves 4a on both sides in the case where the sealing member 12 is thick or the like, and the sealing member 12 can be suppressed from flowing into the groove 4a in the center by the wall portions 4d. This makes it easy to form the connecting sections 4. However, adjacent grooves 4a may be connected to each other in the region where the grooves 4a do not overlap with the cover 16 when viewed in a see-through plan view, as in FIGS. 7B and 7D.

The widths of the end portions on the outer sides of the grooves 4a that form the connecting sections 4 may be greater or smaller than the widths of the end portions on the inner sides. If the widths of the end portions on the outer sides of the grooves 4a are greater than the widths of the end portions on the inner sides thereof, when air moves between the region E and the region F through the connecting sections 4, dust and the like can be stopped at the end portions on the inner sides of the grooves 4a, which makes it possible to suppress the dust and the like from entering into the region F and adhering to the image element 11. On the other hand, if the widths of the end portions on the outer sides of the grooves 4a are smaller than the widths of the end portions on the inner sides thereof, when air moves between the region E and the region F through the connecting sections 4, dust and the like can be suppressed from entering into the connecting sections 4.

Next, a manufacturing method of the substrate for mounting an imaging element 1 according to the present embodiment will be described.

Note that the example of the manufacturing method described below is a manufacturing method that uses a multipiece wiring base plate.

(1) First, there is a process of forming the ceramic green sheets to serve as the layers 2a that form the base 2. For example, in the case of obtaining the insulating base 2 from an aluminum oxide ($Al_2O_3$)-based sintered body, a powder such as silica ($SiO_2$), magnesia (MgO), or calcia (CaO) is added as a sintering aid to the $Al_2O_3$ powder. A suitable binder, a solvent, and a plasticizer are furthermore added, and the mixture is kneaded together into a slurry. Then, multipiece ceramic green sheets are obtained through a conventionally-known formation method such as a doctor blade method, a calender roll method, or the like.

Note that in the case where the base 2 is formed from a resin, for example, the base 2 can be formed through a method such as a transfer mold method or an injection mold method, using a mold that enables the resin to be formed into a predetermined shape. Meanwhile, the base 2 may be formed by impregnating a base material formed of glass fibers with a resin, such as glass epoxy resin. In this case, the base 2 can be formed by impregnating a base material formed of glass fibers with an epoxy resin precursor and thermally curing the epoxy resin precursor at a predetermined temperature.

(2) Next, there is a process of coating and filling the obtained ceramic green sheets with a metal paste through a screen printing method or the like. By firing this metal paste at the same time as the ceramic green sheets that will serve as the base 2, the imaging element connection pads 3 provided on the base 2, the external terminal 10 provided on the bottom surface or the side surface of the base 2, and through-hole conductors or wire conductors are formed. This metal paste is created so as to have an appropriate viscosity by adding a suitable solvent and binder to a metal powder of tungsten, molybdenum, manganese, silver, copper, or the like and kneading the mixture.

Note that glass, ceramics, or the like may be included as well in order to increase the joint strength with the base 2.

Note also that in the case where the uppermost layer 2a (2A) is formed from a metal material, that layer is formed as described above using the metal paste described here.

On the other hand, in the case where the uppermost layer 2a (2A) is formed from a coating layer that is itself formed from a ceramic material, that layer may be formed as described above using a ceramic paste.

(3) Next, there is a process of forming areas to serve as wall surfaces of the layers 2a, areas to serve as the grooves 4a, and the like by punching out using a punch mold or laser processing. Meanwhile, in this process, the slits 4b indicated in the example illustrated in FIG. 4A may be formed in the ceramic green sheet that will serve as the uppermost layer 2a.

(4) Next, there is a process of creating a ceramic green sheet laminated body by laminating and compressing the ceramic green sheets that will serve as each insulation layer.

(5) Next, there is a process of firing the ceramic green sheet laminated body at a temperature of approximately 1,500 to 1,800° C. to obtain a multipiece substrate in which a plurality of bases 2 including the layers 2a are arranged. Note that the aforementioned metal paste becomes the imaging element connection pads 3, the external terminal 10, or the wire conductors in this process.

(6) A method in which split grooves are formed in places of the multipiece substrate obtained through the firing in locations that will serve as the outer edges of the bases 2 and the multipiece substrate is then divided along those split grooves, or a method in which the multipiece substrate is cut, by slicing or the like, along places that will serve as the outer edges of the insulating base material 2 can be used. Although the split grooves can be formed by forming cuts in the multipiece substrate at a depth less than the thickness of the multipiece substrate using a slicing device after the firing, the split grooves may be formed by pressing a cutter blade against the ceramic green sheet laminated body used for the multipiece substrate, forming cuts in the ceramic green sheet laminated body at a depth less than the thickness of the ceramic green sheet laminated body using a slicing device, or the like.

The substrate for mounting an imaging element 1 is obtained through the aforementioned processes (1) to (6).

By mounting the imaging element 11 on the imaging element mounting section 5 of the substrate for mounting an imaging element 1 obtained in this manner and then mounting the substrate for mounting an imaging element 1, on which the imaging element 11 is mounted, onto an external circuit base plate (not illustrated), the imaging element 11 is electrically connected to the external circuit base plate via the imaging element connection pads 3, the external terminal 10, and the like.

Second Embodiment

Figure 8A:
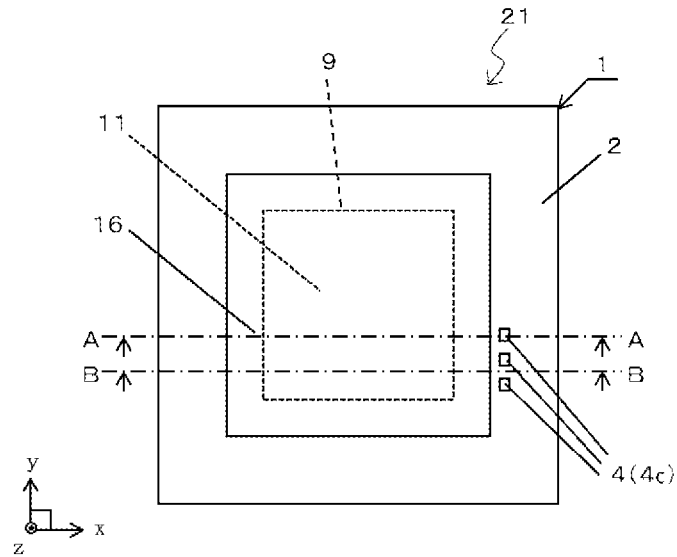
FIG. 8A is a see-through plan view illustrating imaging device according to a second embodiment of the present invention.
Figure 8B:
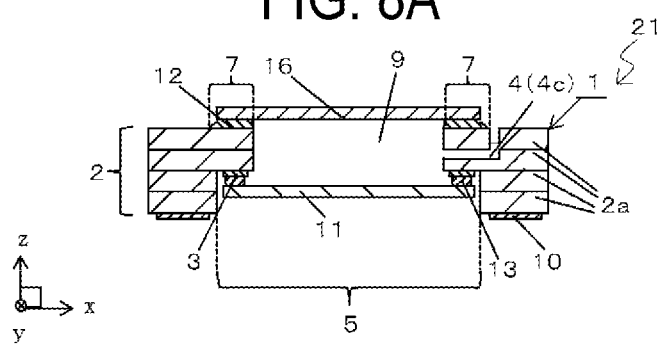
FIG. 8B is a cross-sectional view illustrating a vertical cross-section taken along an A-A line in FIG. 8A.
Figure 8C:
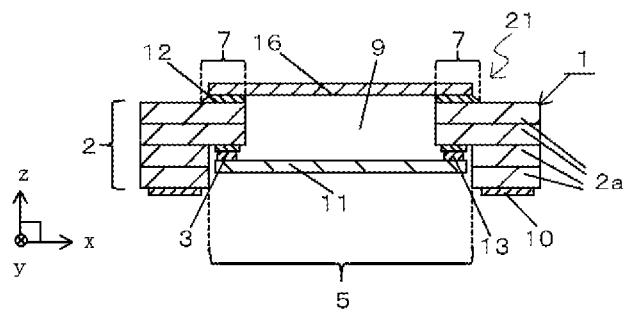
FIG. 8C is a cross-sectional view illustrating a vertical cross-section taken along a B-B line in FIG. 8A.

Next, an imaging device 21 according to a second embodiment of the present invention will be described with reference to FIGS. 8A to 8C.

The imaging device 21 according to the present embodiment differs from the imaging device 21 according to the aforementioned first embodiment in that the connecting sections 4 are formed from through-portions 4c that communicate with the intermediate region 6 through the interior of the base 2. By employing such a configuration, sudden pressure changes caused by fluctuations in the volume of the intermediate region can be reduced, condensation can be suppressed from forming on the cover, the surfaces of the lenses, and the like, and forming the connecting sections 4 need not be taken into consideration when joining the base 2 and the cover 16 using the sealing member 12; as a result, it is easy to control the sealing member 12.

In the case where the base 2 is formed from electrically-insulative ceramics, for example, the processes described below can be used as a method for forming the through-portions 4c that will serve as the connecting sections 4. First, a punch mold, a laser, or the like is used to form grooves, through-holes, or the like in areas of a ceramic green sheet that will serve as the through-portions 4c. The substrate for mounting an imaging element 1 according to the second embodiment of the present invention can be formed by then laminating and compressing ceramic green sheets in which through-holes are formed in the top surfaces of the grooves and firing the base 2 formed of the ceramic green sheets.

The present invention is not intended to be limited to the examples described in the foregoing embodiments, and many variations can be made thereon. For example, the grooves 4 that form the connecting sections 4 may have a circular shape or another quadrangular shape rather than a rectangular shape.

The arrangement, numbers, shapes, and the like of the imaging element connection pads 3, and the external terminal 10 in the aforementioned embodiments are not specified.

Furthermore, the shape, size, and the like of the uppermost layer 2a (2A) in the aforementioned embodiments are not specified. For example, the uppermost layer 2a (2A) may be positioned so that the outer periphery thereof is located further inward than the outer periphery of the base 2.

REFERENCE NUMBER

1 . . . Substrate for mounting an imaging element
2 . . . Base
2a . . . Layer
2A . . . Uppermost layer
3 . . . Imaging element connection pad
4 . . . Connecting section
4a . . . Groove
4b . . . Slit
4c . . . Through-portion
4d . . . Wall portion
5 . . . Imaging element mounting section
6 . . . Intermediate region
7 . . . Cover mounting region
8 . . . Lens-housing mounting region
9 . . . Through-hole
10 . . . External terminal
11 . . . Imaging element
12 . . . Sealing member
13 . . . Joining member
14 . . . Lens housing
15 . . . Lens
16 . . . Cover
21 . . . Imaging device
22 . . . Imaging module
E . . . First region
F . . . Second region

What is claimed is:

1. A substrate for mounting an imaging element, comprising a base;
the base comprising:
a through-hole having an opening in a top surface of the base;
a cover mounting region provided on the top surface, in a rim of the opening of the through-hole;
a lens-housing mounting region provided on the top surface, on an outer side of the cover mounting region;
an intermediate region provided on the top surface, between the cover mounting region and the lens-housing mounting region;
a connecting section that enables the intermediate region to communicate with an inside wall of the through-hole; and
an imaging element mounting section provided on a bottom surface of the base;
wherein
the base comprises a groove that forms the connecting section, and
the base is formed of a plurality of layers, and
the groove is formed of a slit provided in an uppermost layer.

2. The substrate according to claim 1, wherein
in the base,
the uppermost layer is formed from one of a ceramic material and a metal material, and
the plurality of layers aside from the uppermost layer are formed from a ceramic material.

3. The substrate according to claim 1, wherein
when viewed cross-sectionally, the groove increases in width toward an upper side thereof.

4. The substrate according to claim 1, wherein
three or more grooves are provided in a row.

5. The substrate according to claim 1, wherein
one end portion of the connecting section is, when viewed in a plan view, located on an outer side of the cover mounting region, and is, when viewed in a plan view, located on an inner side of the lens-housing mounting region.

6. An imaging device comprising:
the substrate for mounting the imaging element described in claim 1;
the imaging element mounted on the imaging element mounting section of the substrate for mounting the imaging element; and
when viewed in a see-through plan view, a transparent cover disposed on the cover mounting region so as to cover the opening.

7. The imaging device according to claim 6, wherein
the transparent cover and the substrate for mounting the imaging element are joined by a jointing material; and
a groove portion is provided in the joining material along the groove.

8. The substrate according to claim 4, wherein
the connecting sections are formed of three grooves, and the area of the groove located in the center is greater than the areas of the grooves located on both sides.

9. The substrate according to claim 4, wherein
the connecting sections are formed of three grooves, and the area of the groove located in the center is smaller than the areas of the grooves located on both sides.

10. The substrate according to claim 4, wherein
the connecting sections are formed of three grooves, and the widths of wall portions that separate adjacent grooves are lower than the widths of grooves.

11. The substrate according to claim 4, wherein
the connecting sections are formed of three grooves, and the widths of wall portions that separate adjacent grooves are greater than the widths of grooves.

\* \* \* \* \*